United States Patent [19]

Alphonse et al.

[11] Patent Number: 4,821,276

[45] Date of Patent: Apr. 11, 1989

[54] SUPER-LUMINESCENT DIODE

[75] Inventors: Gerard A. Alphonse, Princeton; Frank Z. Hawrylo, Trenton; Maria Harvey, Princeton, all of N.J.

[73] Assignee: General Electric Company, Schenectady, N.Y.

[21] Appl. No.: 40,979

[22] Filed: Apr. 20, 1987

[51] Int. Cl.[4] .................... H01S 3/19; H01L 33/00
[52] U.S. Cl. ........................................ 372/45; 357/17; 372/46
[58] Field of Search ............... 372/43, 45, 46; 357/17

[56] References Cited

U.S. PATENT DOCUMENTS

| 4,251,780 | 2/1981 | Scifres et al. | 372/46 |
|---|---|---|---|
| 4,323,856 | 4/1982 | de Waard | 372/46 |
| 4,432,091 | 2/1984 | Kuroda et al. | 372/45 |

FOREIGN PATENT DOCUMENTS 0141282  8/1984  Japan ..................................... 372/43

OTHER PUBLICATIONS

L. N. Kurbatov et al., "Investigation of Superluminescence Emitted by a Gallium Arsenide Diode," Soviet Physics—Semiconductors, vol. 4, No. 11, May 1971, pp. 1739–1744.
G. A. Alphones et al., "High-Power Superluminescent Diodes," OSC Conference, Jan. 19–21, 1987.
J. Niesen et al., "High Power 0.83um Angle Stripe Superluminescent Diode," Southwest Optics Conference, Feb. 1987.
G. A. Alphonse, "Superluminescent Diode Development," May 1986.
N. K. Dutta et al., "Optical Properties of a GaAlAs Superluminescent Diode," IEEE Journal of Quantum Electronics, vol. QE-19, No. 4, Apr. 1983, pp. 496–498.
I. P. Kaminow et al., "Measurement of the Modal Reflectivity of an Antireflection Coating on a Superluminescent Diode," IEEE Journal of Quantum Electronics, vol. QE-19, No. 4, Apr. 1983, pp. 493–495.
W. Heitmann, "Reactively Evaporated Films of Scandia and Yttria," Applied Optics, vol. 12, No. 2, Feb. 1973, pp. 394–397.
M. B. Holbrook et al., "External Cavity Operated Angled-Stripe Geometry DH Lasers," Applied Physics Letter 36(5), Mar. 1, 1980, pp. 349–350.
I. Ladany et al., "Scandium Oxide Antireflection Coatings for Superluminescent LEDs", Applied Optics, vol. 25, No. 4, Feb. 15, 1986, pp. 472–473.
D. R. Scifres et al., "GaAs/GaAlAs Diode Lasers with Angled Pumping Stripes," IEEE Journal of Quantum Electronics, vol. Qe-14, No. 4, Apr. 1978, pp. 223–227.
D. R. Kaplan et al., "Exact Calculation of the Refelection Coefficient for Coated Optical Waveguide Devices," AT&T Bell Laboratories Technical Journal, vol. 63, No. 6, Jul.–Aug. 1984, pp. 857–877.
E. Mohn et al., "Operation of a Gallium Arsenide Diode Laser with an External Resonator Using a Brewster Window," Physics Letters, vol. 24A, No. 11, May 22, 1967, pp. 561–562.
W. A. Hardy et al., "Tunable Solid State Laser," IBM Technical Disclosure Bulletin, vol. 6, No. 8, Jan. 1964, pp. 66–67.
M. Wada et al., "A New Chemical Etching Technique for Formation of Cavity Facets of (GaAl)as Lasers," IEEE Journal of Quantum Electronics, vol. QE-21, No. 6, Jun. 1985, pp. 658–662.

Primary Examiner—William L. Sikes
Assistant Examiner—Georgia Y. Epps
Attorney, Agent, or Firm—William Squire; James C. Davis, Jr.; Paul R. Webb, II

[57] ABSTRACT

A low coherence light-emitting device comprises a semiconductor body with a pair of end faces, The device contains an optical beam path which has an axis of symmetry extending between the end faces. At least one of the end faces is inclined at an angle which is nonperpendicular to the optical axis and the tangent of this angle is greater than or equal to the width of the beam path divided by the length of the body between the end faces. The device may be made by forming at least one of the end faces such that the end face is inclined at an angle relative to a plane perpendicular to the optical axis. The tangent of the angle is greater than or equal to the width of the optical path divided by the length of the body between the end faces.

11 Claims, 2 Drawing Sheets

SUPER-LUMINESCENT DIODE

The government has rights in this invention pursuant to a government contract.

The invention relates to a super-luminescent diode having a radiation confining region whose axis of symmetry is nonperpendicular to one of the diode's end faces.

Of interest are copending applications Ser. No. 040,976 entitled "Optical Coupling System" by Minora Toda et al. (RCA 82,988), Ser. No. 040,978 entitled "Low Coherence Optical System Having Reflective Means" by G. A. Alphonse et al. (RCA 82,986) and Ser. No. 040,977 entitled "Super Liminescent Diode" by G. A. Alphonse et al. (RCS 82,984) all filed concurrently herewith and assigned to the assignee of the present invention.

BACKGROUND OF THE INVENTION

High power radiation emitting devices, such as semiconductor lasers, typically comprise a body of semiconductor material having opposed end faces in which an active layer is positioned between two cladding regions of opposite conductivity. Gain which is necessary for these high power devices results from a population inversion which occurs when applied current is increased. The end faces of the body form a resonant cavity such that radiation generated in the active layer is partially reflected back into the semiconductor body by an end face toward the opposing end face. When the current is sufficiently increased above some threshold value the increase in gain causes lasing action to occur. Lasers emit a narrow band of highly coherent radiation having a coherence length of approximately 2 centimeters(cm). Coherent radiation, or radiation having a high spectral modulation, is undesirable in some applications, such as fiber optic gyroscopes, which require high power devices which emit radiation having low coherence. Other devices such as light emitting diodes (LED's) emit a broad band of radiation but operate at low power, insufficient for high power applications.

Super-luminescent diodes (SLDs) provide a high power output of broad band low coherent radiation, that being radiation having a coherence length of less than about 200 micrometers ($\mu$m) and typically about 50 $\mu$m. An SLD typically has a structure similar to that of a laser, with lasing being prevented by antireflection coatings formed on the end faces. These coatings must reduce the reflectivity of the end faces to about $10^{-5}$ or less to prevent lasing in a high power SLD and further, this reflectivity must be reduced to about $10^{-6}$ or less to achieve low spectral modulation. Spectral modulation is the percentage ratio of the difference between the maximum and minimum power output divided by the sum of the maximum and minimum power output and low spectral modulation is 5% or less modulation. Unfortunately, low reflectivity of about $10^{-6}$ at the end faces is difficult to obtain consistently for a given output wavelength and even a slight temperature change which alters the output wavelength will change the reflectivity, thus making the manufacture of a low spectral modulation SLD extremely difficult.

Other SLD structures utilize a stripe interrupt geometry in which a metallized stripe is formed over a portion of an active region. This stripe extends from one end face towards but not up to the opposing end face. During device operation of these SLDs a reflecting interface is formed under the end of the metallized stripe which does not extend to the opposing end face due to differences in propagation characteristics in the active region, where current is not supplied by the metallized stripe. This interface results in high spectral modulation even at moderate power levels.

Due to the aforementioned problems, an SLD has been limited to a maximum output power of about 7 mw continuous wave (cw) and has had high spectral modulation, typically 50% at maximum power and 20% at half power. Thus, it would be desirable to have an alternative construction for SLDs and method for making same.

SUMMARY OF THE INVENTION

A low coherence light-emitting device comprises a body having a pair of end faces and an optical path extending between the end faces. The optical path has an axis of symmetry and at least one of the end faces is inclined at an angle relative to a plane perpendicular to the optical axis. The tangent of this angle is greater than or equal to the width of the optical beam path divided by the length of the body between the end faces.

The invention also includes a method of making the low coherence device by forming at least one of the end faces such that the end face is inclined at an angle relative to a plane perpendicular to the optical axis. The tangent of the angle is greater than or equal to the width of the optical path divided by the length of the body between the end faces.

DETAILED DESCRITPION OF PREFERRED EMBODIMENTS

Figure 1:
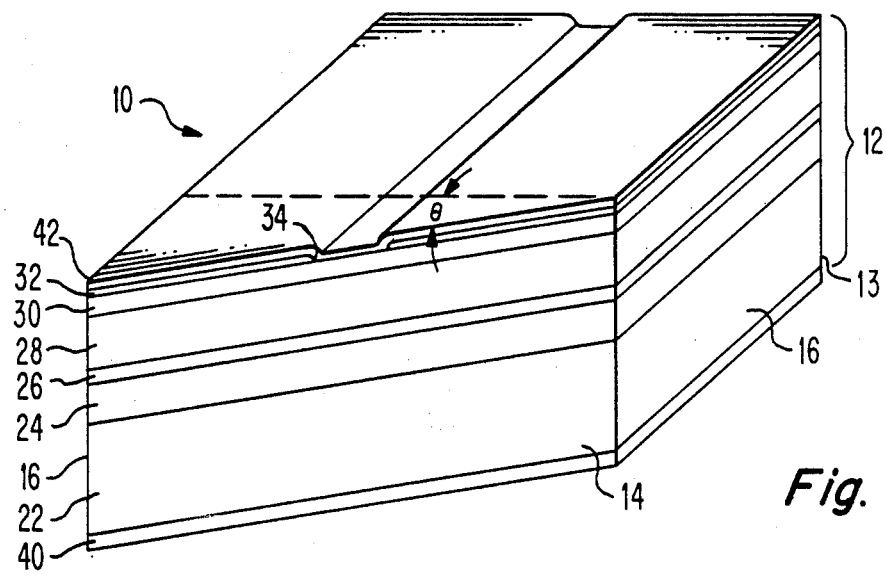
FIGS. 1 and 3 are perspective views of different embodiments of a light-emitting device of the invention.
Figure 2:
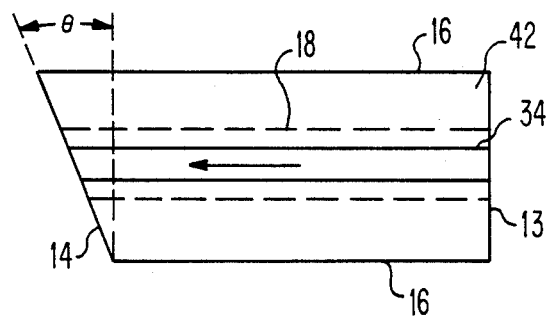
FIG. 2 is a top view of the light-emitting device of FIG. 1.

As shown in FIG. 1, a light-emitting device 10 comprises a body 12 having first and second opposed end faces 13 and 14, respectively, and sidewalls 16 extending therebetween. As shown in FIG. 2, the body contains an optical path 18 having an optical axis of symmetry. At least one of the opposed end faces 13 and 14, respectively is inclined at an angle $\theta$ relative to the plane perpendicular to the optical axis. The body 12 includes a substrate 22 having a first cladding layer 24 thereon, an active layer 26 overlying the first cladding layer 24, a second cladding layer 28 overlying the active layer 26, and a capping layer 30 overlying the second cladding layer 28. An electrically insulating layer 32, having an aperture 34 therethrough, extends between the end faces 13 and 14, respectively, and overlies the capping layer 30. A means for electrically contacting the body 12 comprises a first electrical contact 40 which overlies the surface of the substrate 22 opposite the first cladding layer 24 and a second electrical contact 42 which overlies the capping layer 30 in the aperture 34.

The tangent of the angle $\theta$ must be greater than or equal to the effective width of the optical path 18 in the device divided by the length of the body between end faces 13 and 14, respectively. This minimizes the Fabry-Perot reflections which occur in a laser cavity due to the reflections occurring between the end faces 13 and 14, respectively.

The width of the effective optical beam path 18 is typically determined by obtaining an intensity beam profile by attaching a camera and a linear array of detectors to a microscope. The camera provides a direct view of the emitting facet and the output of the detectors provides an intensity beam profile. Alternatively, a vidicon camera in which a charge density pattern is formed on a photoconductor may be scanned with an electron beam in a single line to obtain the intensity beam profile. Typically, the beam width is determined by the half width of the beam profile. Alternatively, the 2o or 3o widths of the profile may be used to further reduce any possible feedback.

The angle $2\theta$ must also exceed the critical angle $\theta_c$ for reflections which occur at the boundary of the optical path. For example, as shown in FIG. 1, the fulcrum of the angle $\theta$ may extend in the transverse direction, that being the direction perpendicular to the plane of the layers. Therefore, when radiation generated in the device 10 travels along the optical path 18, the light which is reflected by the end face will travel in a direction which has components in both the direction parallel to the optical axis and the lateral direction, that being the direction perpendicular to the sidewalls 16. Therefore, the reflected radiation will travel in the plane of the layers and will be absorbed by the active layer 26 outside the optical path 18. However, the active layer 26 has differences in its effective refractive index between that portion of the active layer 26 containing the optical path 18 and the remaining portion of the active layer 26. These differences in refractive index serve as boundaries which confine radiation within the optical beam path of the device, providing total internal reflection and thereby resulting in high spectral modulation. Therefore, the angle $2\theta$ must be greater than the critical angle to prevent reflections in the optical path at these boundaries. The critical angle $\theta_c$ is determined as follows:

$$\theta_c = \mathrm{Sin}^{-1}[1-(n_2/n_1)^2]^{\frac{1}{2}}$$

wherein $n_1$ is the effective refractive index of the active layer 26 containing the optical beam and is typically about 3.355 for AlGaAs and $n_2$ is the effective refractive index of the remaining portion of the active layer and is typically about 3.35 for AlGaAs. Therefore, $\theta_c$ is typically about 3.13° and the angle $2\theta$ must be greater than 3.13° and is chosen to be about 5° to account for diffraction spread. The angle $\theta$ may be about equal to the Brewster angle which is equal to the inverse tangent of the refractive index of the medium adjacent the first end face 13, divided by the transverse effective refractive index for light propagating between the end faces 13 and 14, respectively. The medium adjacent the first end face 13 is typically air having a refractive index of about 1 and the refractive index of the body 12 is typically 3.35 for GaAs devices. Thus, the Brewster angle is typically about 16.6°. At the Brewster angle the radiation vibrating in the plane of incidence is not reflected, thus resulting in radiation which is predominantly polarized. Further, at this angle the reflected and refracted rays are 90° apart resulting in a non-reflective condition at the emitting end face. This condition allows the elimination of antireflection coating on the device's end faces which are typically used to increase output.

Figure 3:
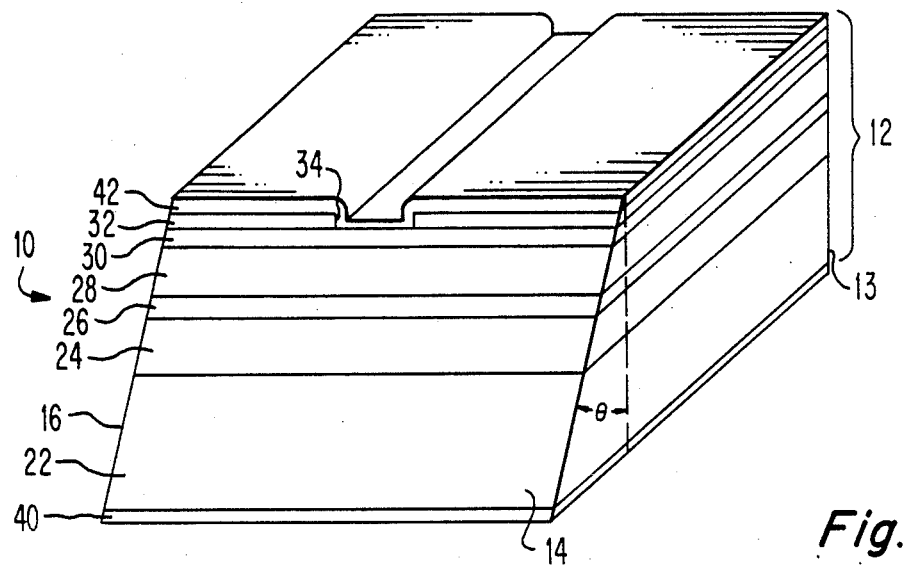

It should be understood that the fulcrum of the angle $\theta$ may extend in other directions, such as the lateral direction, as shown in FIG. 3. Accordingly, the radiation reflected from the inclined facet will travel in a direction whose components are in both the direction parallel to the optical axis and the transverse direction. Therefore, the reflected radiation will be absorbed by the first and second cladding layers 24 and 28, respectively, which typically have an effective refractive index of about 3.25. Since the effective refractive index of the active layer is about 3.35 for AlGaAs, $\theta_c$ is typically about 14°. It should be understood that the differences in effective refractive index between the layers may necessitate that $\theta_c$ be greater than the critical angle of the interface between the emitting end face of the device 10 and the medium adjacent the emitting end face. However, if this angle is exceeded, the radiation will not be emitted from the emitting end face and will undergo total internal reflection.

The end face which is inclined may be either the first or second end face 13 and 14, respectively. Preferably, the emitting end face is inclined and the non-emitting end face is perpendicular to the optical axis and has a lens with a reflective coating thereon positioned adjacent the non-emitting end face to provide a means for redirecting a portion of the radiation back into the device such as disclosed by Gerard A. Alphonse in copending U.S. application (RCA No. 82,986) entitled "Low Coherence Optical System Having Reflective Means." This embodiment will provide greatly increased radiation from the emitting end face since the device 10 may be modeled as an amplifier in which the output is related to an exponential function of the length of the optical path 18 and a function of the current density in the device 10. Thus, the reflected radiation from the non-emitting end face when redirected into the active layer 26, will be reamplified exponentially resulting in increased radiation from the emitting end face.

The substrate 22, first cladding layer 24, and capping layer 30 are of one conductivity type and the second cladding layer 28 is of the opposite conductivity type. The refractive index of the active layer 26 is typically greater than the refractive index of both the first and second cladding layers 24 and 28, respectively. The body is typically composed of binary group III–V compounds such as GaAs and alloys of such compounds.

The substrate 22 is typically composed of N-type GaAs about 100 micrometers ($\mu$m) thick and has a first major surface parallel to or slightly misoriented from the (100) crystallographic plane. The first cladding layer 24 typically combines the function of a buffer layer and a cladding layer. The first and second cladding layers 24 and 28 respectively, are about 1.5 $\mu$m thick and are typically composed of $Al_xGa_{1-x}As$ where x is generally between about 0.3 and 0.4 and typically about 0.4. The active layer 26 is typically about 0.08 $\mu$m thick and is generally composed of $Al_xGa_{1-x}As$ where x is between about 0 and 0.1, depending on the wavelength to be emitted. The capping layer 30 is typically about 0.5 $\mu$m thick and is typically composed of N-type GaAs with zinc diffused therethrough in the region of the aperture 34. The insulating layer 32 is typically about 0.01 $\mu$m thick and is preferably composed of silicon oxide deposited by pyrolytic decomposition of a silicon-containing gas, such as silane, in oxygen or water vapor.

Figure 4:
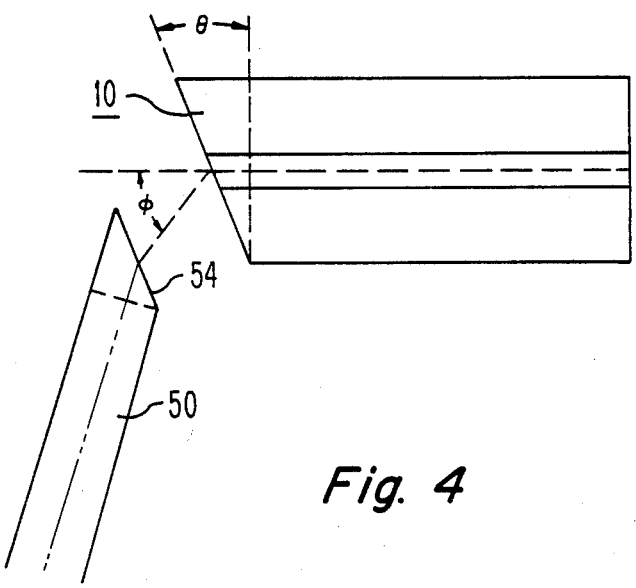
FIG. 4 is a top view of an optical system for coupling radiation from the light-emitting device of the present invention into an optical fiber.

Typically, the emitted radiation has an axis of symmetry which is inclined at an output angle $\phi$ relative to the direction parallel to the optical axis of symmetry. The output angle $\phi$ is determined by:

$$\phi = \text{Sin}^{-1} \frac{n_1 \text{Sin}\theta}{n_2}$$

where $n_1$, is the transverse effective refractive index of the device 10 and $n_2$ is the refractive index of the medium adjacent the first end face. For example, as shown in FIG. 4, a GaAs device 10 in air having an angle $\theta$ of 16.6° will emit radiation at an output angle $\phi$ of about 73.3° relative to the longitudinal direction. Optical coupling from the device 10 to a receiving device such as an optical fiber 50 may be obtained by inclining the fiber's end face 54 such that it is nonperpendicular relative to the fiber's axis and radiation propagates along the fiber's axis such as disclosed by M. Toda et al. in a copending U.S. patent application (RCA No. 82,988) entitled "Optical Coupling System."

The body 12 may be fabricated using liquid-phase epitaxy techniques to deposit the layers. Suitable liquid-o phase epitaxy techniques have been disclosed by Nelson in U.S. Pat. No. 3,565,702 and Lockwood et al. in U.S. Pat. No. 3,753,801, both incorporated herein by reference.

The first electrical contact 40 is preferably composed of sequentially deposited germanium, gold, nickel, and gold layers. The second electrical contact 42 is preferably composed of titanium, platinum and gold layers which are sequentially deposited onto a zinc or cadmium diffused surface.

The end faces are typically inclined by mounting the device 10 at a desired inclination on a polishing fixture and subsequently polishing the device until the desired cut is made. Alternatively, the inclination may be made by sawing, wire cutting, grinding or ion milling. It may be desirable to employ chemical etching to avoid stresses being created in the device 10. Accordingly, an etchant may be used whose etching rate is a function of the mole fraction of the device's composition. A sulfuric acid and hydrogen peroxide etchant will result in an etching profile which is a function of the Aluminum mole fraction of the device. Therefore, since each layer of the device 10 has a different Aluminum mole fraction, the etching will produce an angle across the layer.

In the operation of the device 10, a bias voltage of the proper polarity is applied to the electrical contacts 40 and 42 respectively, producing light emission in the active region. The inclined end face provides a means for reducing on-axis reflections of radiation between the end faces, resulting in an emission having low coherence.

We claim:

1. In a super luminescent gain guided light emitting device which includes:
    a semiconductor body having spaced first and second opposed end faces with an active regio extending therebetween, said end faces being spaced apart a given distance at said active region, said device comprising a crystal structure having a plurality of crystal planes wherein said active region is approximately parallel to one of said planes, said end faces normally lying in parallel first and second planes normal to said one plane, said device having a first current confining structure therein comprising a linear strip of material adjacent to a side of said active region, said structure being arranged to form an effective optical beam path between the end faces at said active region, said beam path having an optical axis of symmetry determined by and parallel to said current confining structure, said path being oriented so that said axis of symmetry intersects said end faces, said path having a given width transverse said optical axis, wherein the improvement comprises:
    at least one of said end faces being inclined at an angle non-parallel relative to said first and second planes, said linear strip and optical axis being perpendicular to said first and second planes, one of said at least one end faces emitting light from said beam path, the tangent of twice said angle being greater than or equal to the width of said effective optical beam path divided by said given distance;
    said angle having a value such that light parallel to said axis incident on said at least one end face and reflected from that one end face toward said beam path is caused to e substantially refracted out of the beam path when incident on the boundary between the effective optical beam path and the adjacent semiconductor body outside the beam path;
    the values of said tangent and angle being such that together said values tend to minimize the spectral modulation within said path.

2. The device of claim 1 wherein the fulcrum of said angle extends in the transverse direction.

3. The device of claim 2 wherein said device has an active region having a major surface perpendicular to a transverse direction and twice said angle exceeds the critical angle for substantially preventing reflections in the lateral direction of said active region.

4. The device of claim 3 wherein said angle is greater than about 3.13°/2.

5. The device of claim 1 wherein the fulcrum of said angle extends in the lateral direction.

6. The device of claim 5 wherein said device has an active region bounded by a pair of cladding layers and twice said angle exceeds the critical angle for substantially preventing reflections by said cladding layers.

7. The device of claim 6 wherein said angle is greater than about 14°.

8. The device of claim 1 wherein the width of the optical team path is about equal to the half width of the itensity beam profile.

9. The device of claim wherein said angle is about equal to the Brewster angle.

10. The device of claim 1 wherein the inclined end face is the end face from which radiation is emitted.

11. The device of claim 1 wherein the end face opposite said inclined end face is substantially perpendicular to said optical axis and has a reflective coating thereon.

* * * * *